United States Patent
Lefevre

(10) Patent No.: US 7,745,838 B2
(45) Date of Patent: Jun. 29, 2010

(54) GLAZING COMPRISING ELECTRONICS ELEMENTS

(75) Inventor: Hugues Lefevre, Jumet (BE)

(73) Assignee: AGC Glass Europe, Brussels (BE)

( * ) Notice: Subject to any disclaimer, the term of this patent is extended or adjusted under 35 U.S.C. 154(b) by 677 days.

(21) Appl. No.: 10/541,672

(22) PCT Filed: Jan. 8, 2004

(86) PCT No.: PCT/EP2004/050007

§ 371 (c)(1),
(2), (4) Date: Aug. 16, 2006

(87) PCT Pub. No.: WO2004/062908

PCT Pub. Date: Jul. 29, 2004

(65) Prior Publication Data

US 2006/0275599 A1    Dec. 7, 2006

(30) Foreign Application Priority Data

Jan. 10, 2003 (BE) .................................. 2003/0023
Nov. 28, 2003 (EP) .................................. 03104456

(51) Int. Cl.
*H01L 29/18* (2006.01)
*H01L 33/00* (2010.01)

(52) U.S. Cl. .............. 257/88; 257/40; 257/99; 257/E25.02; 257/E33.057; 438/108; 438/455; 438/458

(58) Field of Classification Search .......... 257/118, 257/513, 684, 40, 88, 99, 737, 741, 778, 257/779, 783, E25.02, E33.057; 438/108, 438/455, 458
See application file for complete search history.

(56) References Cited

U.S. PATENT DOCUMENTS

| 3,317,906 | A | * | 5/1967 | Baldridge ............... 340/815.55 |
| 4,100,398 | A | | 7/1978 | Levin |
| 5,155,338 | A | | 10/1992 | Hoffmann |
| 5,193,895 | A | * | 3/1993 | Naruke et al. ............... 362/542 |
| 5,367,441 | A | | 11/1994 | Wustlich |
| 5,724,187 | A | * | 3/1998 | Varaprasad et al. ......... 359/608 |
| 6,153,982 | A | | 11/2000 | Reiners |
| 6,270,236 | B1 | | 8/2001 | Brussog |
| 6,283,613 | B1 | * | 9/2001 | Schaffer ..................... 362/245 |

(Continued)

FOREIGN PATENT DOCUMENTS

DE    29716214 U1    12/1997

(Continued)

OTHER PUBLICATIONS

English translation of Publication DE10019888, Zenker et al., Oct. 10, 2001.*

*Primary Examiner*—Mary Wilczewski
*Assistant Examiner*—Telly D Green
(74) *Attorney, Agent, or Firm*—Oblon, Spivak, McClelland, Maier & Neustadt, L.L.P.

(57) ABSTRACT

The invention consists of inserting electronic components into a glazing, in particular a laminated glazing, in order to create new features, in particular for automotive applications, windscreen, rear window or side windows. The inserted electronic components can be optoelectronic components such as light-emitting diodes (LEDs) providing a lighting function for the glazing, e.g. interior lighting of an automobile. The electrical connections are provided by means of a conductive layer so that they are virtually invisible.

23 Claims, 3 Drawing Sheets

U.S. PATENT DOCUMENTS

| | | | |
|---|---|---|---|
| 6,376,902 B1 * | 4/2002 | Arndt | 257/678 |
| 6,377,321 B1 * | 4/2002 | Khan et al. | 349/35 |
| 6,379,999 B1 * | 4/2002 | Tanabe | 438/113 |
| 2002/0041443 A1 * | 4/2002 | Varaprasad et al. | 359/603 |
| 2002/0149312 A1 * | 10/2002 | Roberts et al. | 313/495 |
| 2003/0087107 A1 * | 5/2003 | Varaprasad et al. | 428/432 |
| 2003/0087476 A1 * | 5/2003 | Oohata et al. | 438/108 |
| 2004/0053125 A1 * | 3/2004 | Giron et al. | 429/152 |
| 2004/0100676 A1 * | 5/2004 | Fanton et al. | 359/254 |

FOREIGN PATENT DOCUMENTS

| | | |
|---|---|---|
| EP | 0177420 A1 | 4/1986 |
| EP | 0608180 A1 | 7/1994 |
| EP | 0900971 A1 | 3/1999 |
| EP | 1071142 A2 | 1/2001 |
| EP | 1071142 A3 | 1/2001 |
| EP | 1346822 A1 | 9/2003 |
| GB | 1401497 | 7/1975 |
| GB | 1401497 | 10/1975 |
| JP | 7076131 | 3/1995 |
| WO | WO 01/82378 A1 | 11/2001 |
| WO | WO 03/024649 A1 | 3/2003 |
| WO | WO 2004/009349 | 1/2004 |
| WO | WO 2004009349 A1 * | 1/2004 |

* cited by examiner

GLAZING COMPRISING ELECTRONICS ELEMENTS

CROSS-REFERENCE TO RELATED APPLICATIONS

This application is the entry into the U.S. National Stage of PCT Application No. PCT/EP2004/050007 filed 8 Jan. 2004, and claims priority from European Application No. 03104456.3 filed 28 Nov. 2003 and Belgian Application No. 2003/0023 filed 10 Jan. 2003, the disclosures of all of which are hereby incorporated by reference.

BACKGROUND

The present invention relates to glazing, in particular composed of laminated glass, in which electronic components have been inserted.

The glazing surface is becoming increasingly important in vehicles and buildings. Moreover, this surface is a particular focus for attention for the occupants compared to the exterior of the vehicle or building, and this enables completely new functions to be provided for these types of glazing. Automotive glazing means windscreens, rear windows, side windows, as well as opening and non-opening roofs, rear-view mirrors or protective glass for headlamps.

SUMMARY

The invention consists of inserting electronic components, as well as their connecting circuit, inside a laminated glass in order to provide this with new features such as sensors, lighting units, indicator lights etc.

Of the electronic components of interest for insertion, optoelectronic components such as in particular light-emitting diodes (LEDs), photo-resistors, photodiodes and vision sensors, e.g. such as CCDs (charge-coupled devices) and CMOS (complementary metal oxide semiconductors), are particularly useful as they are in direct contact with the optical aspect of the glazing. However, other electronic components can also be inserted to form complete electronic circuits. These circuits may or may not be visible, depending on the type of components and electrical conductors used.

The insertion of light-emitting diodes (LEDs) into automotive glazing allow the following indicator features, in particular:
  indicator light display intended for the driver of the vehicle or the passengers (e.g. motor temperature warning indicator in the windscreen, indicator for operation of the electric window de-icing system),
  indicator light display intended for persons outside the vehicle (e.g. indicator for operation of the vehicle alarm system in the side windows),
  light display on the glazing of vehicles (e.g. flashing light display on emergency vehicles, hazard display with low power consumption indicating a vehicle at risk).

The insertion of light-emitting diodes (LEDs) in automotive glazing units in particular allows the following lighting features:
  particularly aesthetic ambient lighting of the vehicle interior (e.g. integration of the ambient lighting into the glass roof of the vehicle),
  lights and lamps in the surface of the glazing (e.g. integration of a third stop light into the rear window of the vehicle).

The insertion of light-emitting diodes (LEDs) into automotive glazing units also allows communication and lighting features, in particular:
  infrared transmitter for communication (e.g. garage door remote control, transmitter for automatic toll payment),
  infrared road lighting (e.g. light source in the windscreen for sensor for night driving assistance),
  rain or fog detector (e.g. rain and/or fog sensor inserted into the vehicle glazing and intended for automatic control of windscreen wipers and fog lamps).

In addition, the insertion of photodiodes and photo-resistors into automotive glazing units allows the following detection features in particular:
  measurement of ambient brightness (e.g. light sensor for automatic illumination of headlamps or adjustment of the brightness of the interior lighting of the vehicle),
  infrared communication detector (e.g. receiver for automatic road toll payment),
  temperature sensors.

The insertion of a vision sensor such as CCDs or CMOS active in visible or infrared light into automotive glazing units allows detection and driving assistance features, in particular:
  driving assistance (e.g. CCD or CMOS camera integrated into the rear window of the vehicle),
  night driving assistance (e.g. infrared camera in the windscreen with associated infrared lighting).

In general, the invention relates to all types of electronic circuits integrated into the laminated glazing, in particular circuits for the configuration and amplification of signals output from electromagnetic antennae integrated into these same glazing units as well as control circuits for the lighting systems and sensors outlined above.

A laminated glazing usually comprises two sheets of clear or coloured glass, between which one or more thermoplastic, such as PVB (polyvinyl butyral), sheets are inserted. Commercially available PVB sheets usually have a thickness of 0.38 mm or a thickness of a multiple of 0.38 mm. The greater the increase in the desired resistance of the laminated structure, the more significant the total thickness of the PVB sheet(s) becomes.

It has been found that it is possible to insert any type of electronic components between two sheets of glass, despite their appreciable thickness. For example, there are LEDs with a thickness of 0.6 or 0.8 mm. In this case, the use of 2 or 3 PVB sheets allows insertion of this type of electronic component between two glass sheets. It has been found that the thermal treatment at elevated pressure that is necessary to form a laminated glazing does not impede the proper function of electronic components or their electric connections.

The present invention relates to a laminated glazing comprising at least two glass sheets and one or more thermoplastic interlayers, such as PVB, in which the electronic components as well as their connecting circuit are inserted between the two glass sheets, the connecting circuit being formed from at least one conductive layer.

In accordance with the applications sought, clear, coloured, frosted, sandblasted, screen-printed or any other type of suitable glass sheet shall be used by choice.

In particular, the electronic components can be optoelectronic components such as light-emitting diodes (LEDs).

Advantageously, the electronic components inserted into the glazing according to the invention have a thickness of less than or equal to 3 mm and in particular a thickness in the range of between 0.1 and 1.2 mm.

According to a preferred embodiment, the electrical connections between the components and the power source are formed by means of conductive layers, which may or may not be transparent and are applied either on the inside surface of one or both glass sheets or on the PVB film interposed between the two glass sheets.

Typical conductive layers are, for example, doped oxide-based layers, the thickness of which is generally in the range of between 0.02 and 1µ, preferably between 0.02 and 0.5µ, and more preferred between 0.2 and 0.4µ, and the surface resistance of which can vary between 5 and 80 Ω/sq., preferably between 10 and 80 Ω/sq. and particularly preferred between 12 and 20 Ω/sq. Such layers are made, for example, of indium- or aluminium-doped zinc oxide, fluorine-doped tin oxide or tin doped indium oxide (generally abbreviated to ITO).

Other typical conductive layers are silver-based layers. These conductive layers can be composed of one, two and also three layers of silver (or any other conductive material) separated by dielectric layers. In the case of layers with a total thickness of conductive material in the range of between 10 and 30 nm, the surface resistance can reach very low values in the range of between 2 and 3 Ω/sq. However, any other layer, even a less conductive layer, could be sufficient to form electrical connections between the electronic components. However, the voltage to be applied would have to be increased if the resistance of the layer is more significant.

According to this embodiment, the conductive layer applied to the glass is advantageously divided into two distinct zones forming two conductor tracks, each of the two zones being connected to an electrode. The electronic components can then be arranged in parallel, one of their terminals connecting with the first zone and the other terminal of each component connecting with the second zone of the conductive layer.

The conductive layer can also be divided into numerous zones, each zone connecting one electronic component to the next, and the components can thus be connected in series. Mixed arrangements in series and in parallel can also be provided.

Hence, it is possible to form conductor tracks supplying power to LEDs by applying a conductive layer with solar protection and/or thermal insulation properties over the major portion of the glazing, and by then removing or modifying the conductive layer over narrow bands, e.g. by laser. Any of the known techniques can be used for applying the conductive layer, e.g. vacuum sputtering or pyrolytic vapour deposition.

It is also conceivable to perform the deposition of the conductive layer and the conductor tracks in a single step by using appropriate shields, possibly formed by screen-printing.

The narrow bands without a layer preferably have a width in the range of between 0.01 and 3 mm, preferably in the range of between 0.05 and 1.5 mm, and more preferred between 0.1 and 0.8 mm. This enables electrical connections to be obtained that are virtually invisible, even if the conductive layer is slightly coloured.

The LEDs are generally formed from a semiconductor chip, electrical connecting elements and a casing, the functions of which are numerous (protection from oxidation and humidity, heat dissipation, mechanical support). This casing can have sufficiently small dimensions to be inserted into a laminated glazing. In view of the low light flux provided by current LEDs, it would be necessary to arrange a large number thereof for adequate interior lighting of the automobile and to form a large number of electrical connections, which would render the production process costly.

It is possible to fit LEDs with higher light flux, but in this case the light intensity of each LED is very significant, and this then causes problems of overheating and/or glare.

According to an advantageous embodiment of the invention, several chips are arranged in a joint casing, the dimensions of which are such that its width and/or its length are at least 10-times larger, preferably 20-times larger and more preferred 40-times larger, than its thickness.

This casing is preferably formed from a transparent material or one visually compatible with the glazing used. It is also preferably formed from a material that is sufficiently flexible to allow it to fit the curvatures of the glazing. It can advantageously comprise a light-diffusing surface, which allows the light emitted by the various chips to be smoothed. In particular, the casing comprises 5 to 100 chips, preferably 10 to 50 chips and more preferred 15 to 40 chips. This casing enables an illumination supplying 10 to 500 lumen, preferably 20 to 250 lumen and more preferred 30 to 100 lumen to be provided economically, i.e. without having to glue a large number of LEDs and without having to form a large number of electrical connections.

Preferably, the casing has a length and/or a width in the range of between 5 and 100 mm, preferably between 10 and 75 mm and more preferred between 20 and 50 mm.

The thickness of the casing is preferably less than or equal to 3 mm, preferably less than 2 mm, less than 1.2 mm, less than 1 mm, and most preferred in the range of 0.1 and 0.7 mm.

Such a casing allows only 2 electrical contacts between glass and casing to be formed if the brightness supplied by all the chips reaches about 50 lumen.

According to a particular embodiment of the invention, the glazing has a capacitor switch actuating the power supply of the light element. This switch is formed by a zone of the conductive layer that is insulated from the rest of the conductive layer and functions like the probe of a capacitance circuit. This allows a virtually invisible switch to be provided, which operates by simple finger contact on the insulated zone and can be disposed close to the light element without impairing the visual appeal of the glazing.

According to a preferred embodiment of the invention, the glazing is a laminated glazing, which has two glass sheets attached by means of one or more thermoplastic (generally polyvinyl butyral [PVB]) interlayers, the LEDs and their connecting circuit being inserted between the two glass sheets. In this embodiment, the layers can be applied either on the inside surface of one glass sheet or the other or on the PVB film interposed between the two glass sheets.

The LEDs and in particular their casing or "package" should withstand the temperature and pressure conditions of the autoclaving step necessary for production of laminated units (in the order of 10 to 15 bar and 80 to 150° C. for 1 to 4 hours).

When it is inserted into a laminated glazing, the casing does not necessarily have to meet the requirements of protection against humidity and oxidation generally demanded for classic LED casings and for use on a single glass.

The person skilled in the art could provide any type of arrangement of electrical connections to connect LEDs or chips inside the casing, by choice an arrangement in series, in parallel, or provide a mixed arrangement with the advantage of supplying a uniform brightness.

BRIEF DESCRIPTION OF THE FIGURES

The present invention is illustrated by the following specific non-restrictive practical examples with reference to the figures, wherein.

DETAILED DESCRIPTION

Example 1

Figure 1:
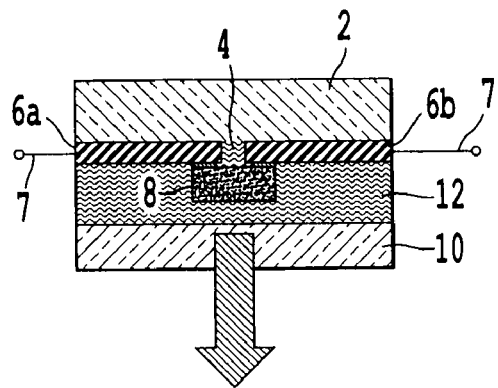
FIGS. 1 to 4 show a laminated glazing in section comprising a light element formed by one or more traditional LEDs.

The following elements have been stacked:
- a green glass sheet 3.6 mm thick comprising a conductive layer based on fluorine-doped tin oxide 300 nm thick and approximately 15 Ω/square, the conductive layer having been removed on a narrow band in order to define two distinct conductive zones;
- 2 clear PVB sheets with a total thickness of 0.76 mm;
- a sufficient number of LEDs to obtain the intended light effect glued onto said zone without a conductive layer, the anode ends of each diode being in contact with one of the two zones of the conductive layer and the cathode sides of each diode being in contact with the other zone of the conductive layer; each of the two zones themselves being connected to an electrode (see, for example, electrodes 7 connected to conductor tracks 6a, 6b, 6c, 6d in FIGS. 1-6, noting that the position and arrangement of the electrodes is merely exemplary and is not intended to indicate an exact or preferred placement);
- 1 clear PVB sheet with a thickness of 0.38 mm;
- one sheet of clear glass 2.1 mm thick.

The assembly is passed through an autoclave for a 120 minute cycle, which includes a minimum of 35 minutes at elevated temperature and pressure (125° C. and 8 bar).

In this embodiment, the LEDs are arranged in parallel. This embodiment has the advantage of providing a completely invisible connecting circuit, even when using two clear glass sheets.

Example 2

FIG. 1 shows a laminated glazing formed as follows. A conductive layer 6 (conductivity of approximately 2 Ω/sq.) was deposited onto a clear soda-lime glass sheet 2 with a thickness of 2.1 mm intended to be the outside glass sheet of the glazing. The conductive layer 6 is removed by laser over narrow bands 4 approximately 0.15 mm wide in order to define conductor tracks 6a, 6b. LEDs 8 with dimensions that do not exceed 0.6 mm in thickness are glued on either side of a narrow band 4 with a conductive adhesive. Typical conductive adhesives are, for example, adhesives comprising silver.

The glass sheet 2 is then laminated, with the coated face towards the inside, with a second sheet 10 of clear soda-lime glass in the traditional manner by interposing a double thermoplastic layer 12 with a total thickness of 0.72 mm.

In the case of the illustrated example, the adhesive must be selected for its resistance to the high temperature and pressure necessary to form the laminated glazing. It should also be selected with respect to its viscosity in order to prevent it from expanding into the insulating band 4 during lamination of the laminated unit.

The light flux emitted by the LED is indicated by the arrow. It is oriented towards the inside glass sheet 10 of the glazing.

Example 3

Figure 2:
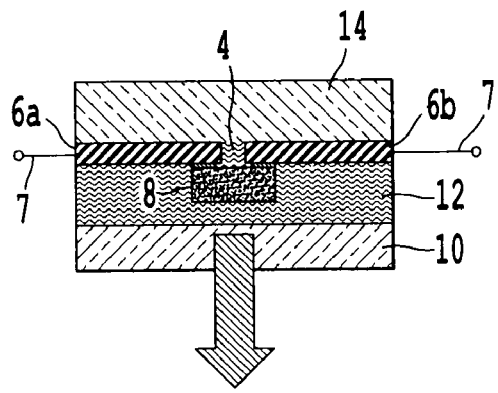

FIG. 2 shows a laminated glazing similar to that in example 1 except that the outside glass sheet is a coloured glass sheet 14. This type of laminated glass is particularly well suited for an automobile roof. Its light transmission (LT) can thus be reduced to 14% and its energy transmission (ET) to 11%.

Example 4

Figure 3:
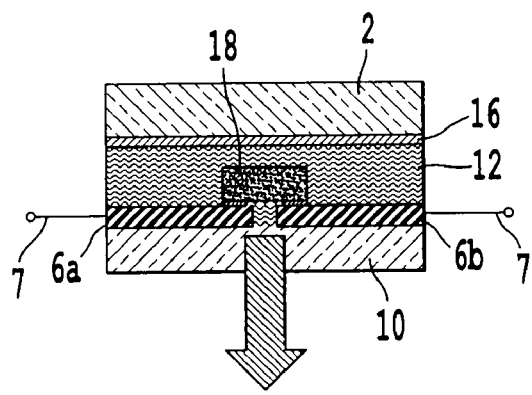

FIG. 3 shows a laminated glazing comprising an outside glass sheet 2 formed from clear soda-lime glass. An opaque decorative layer 16 is applied on a section of the inside surface of the glass sheet 2. The conductive layer 6 in this case is applied on the inside glass sheet 10 on its face turned towards the inside of the laminated glazing. Conductor tracks 6a, 6b are formed, as in the preceding examples, by removing the layer over narrow bands 4. LEDs 18 of the "reverse" type, i.e. provided to be glued by their side that emits light, are glued on the inside glass sheet 10 of the glazing on either side of the bands 4. This embodiment enables the lighting device to be invisible from the outside of the glazing when the LEDs 18 are located behind the opaque layer 16 of the glazing.

Figure 4:
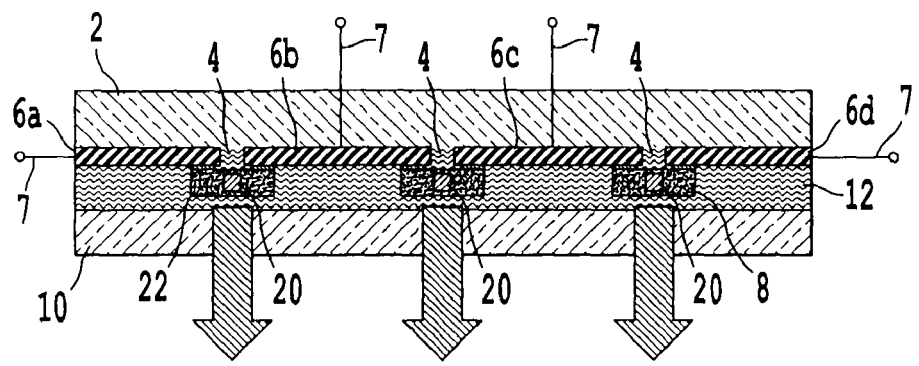

FIG. 4 shows the same embodiment as in FIG. 2. The LEDs 8 are shown with a semiconductor chip 20, each packaged in a casing 22. Separate conductor tracks 6a . . . 6d are necessary to connect each LED 8.

Figure 7:
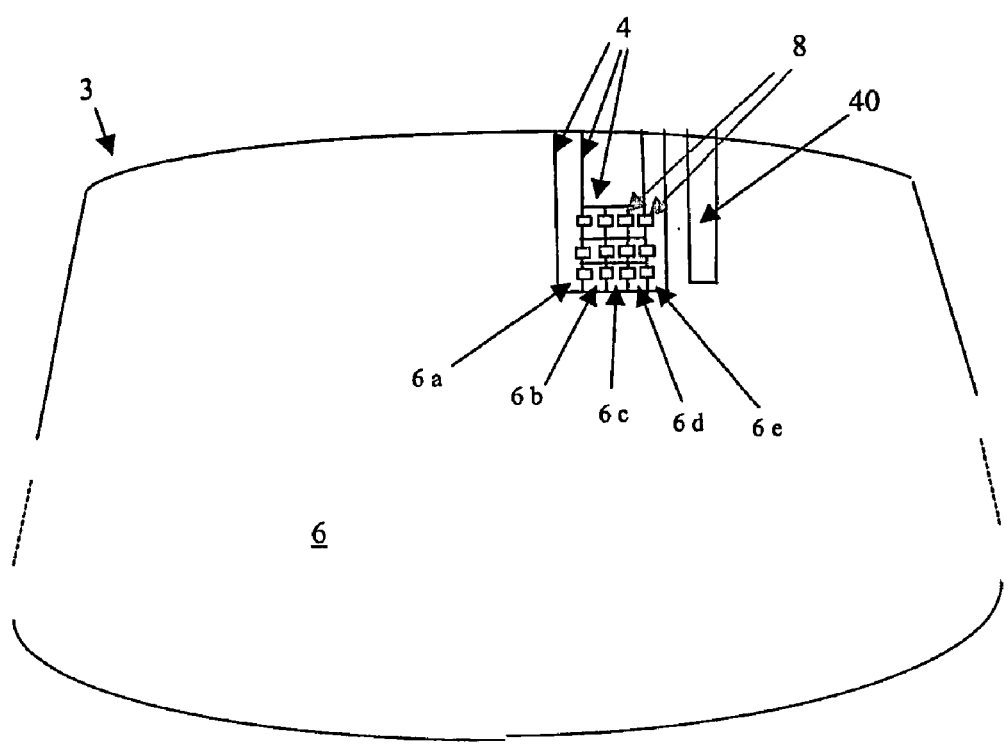
FIG. 7 shows an overall view of a windscreen comprising in its upper section a light element as well as a zone for lighting and extinguishing the light element.

FIG. 7 shows an overall view of the windscreen 34 comprising a light element formed from twelve LEDs 8 in the schematically shown case. Conductor tracks 6a, 6b, . . . 6e defined by bands 4 where the layer 6 has been removed connect each of the LEDs 8 in series. In the illustrated example, 3 series of 4 LEDs 8 are connected in parallel. FIG. 7 also shows a conductive zone 40 defined by insulating bands 4. This zone operates like a capacitor button and allows the light element to be illuminated and extinguished.

Example 5

Figure 5:
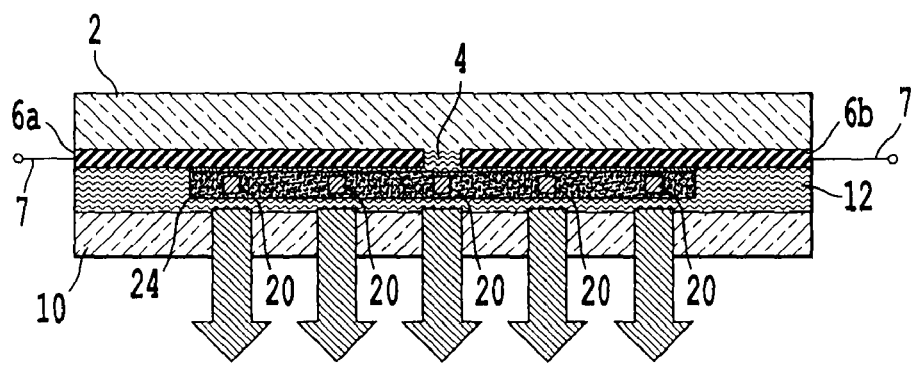
FIGS. 5 and 6 show a laminated glazing comprising a light element formed by special LEDs.

The glazing shown in FIG. 5, like example 1, has the following: an outside glass sheet 2 coated with a conductive layer 6, a thermoplastic interlayer 12 and an inside glass sheet 10. The light element is formed by using an LED specially adapted for this use which has a plurality of semiconductor chips 20 in a single casing 24. This embodiment requires fewer conductor tracks to be formed, i.e. only 2 conductor tracks 6a, 6b, if the light intensity supplied by the semiconductor chips 20 packaged in a single casing 24 is sufficient for the application sought. This embodiment also allows wider bands 4 to be formed between conductor tracks 6a, 6b and prevents any risk of the adhesive flowing into the insulating bands.

Example 6

Figure 6:
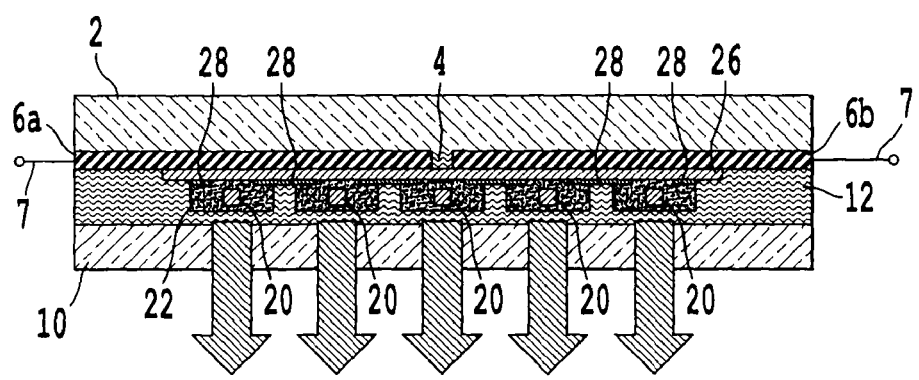

The glazing shown in FIG. 6, like examples 1 and 4, has the following: an outside glass sheet 2 coated with a conductive layer 6, a thermoplastic interlayer 12 and an inside glass sheet 10. The light element is formed by using a flexible film 26, e.g. of PET, on which is glued an assembly of LEDs 8 comprising their casings 22, each enclosing one or possibly several semiconductor chips 20. An electrical connection 28 is provided on the film 26 between each casing 22 and between the last casing and the conductive layer (not shown). As in the preceding example, this embodiment allows few conductor tracks 6a, 6b and relatively wide bands 4 to be formed, and this prevents the flow of adhesive into the band 4. The glazing is formed by gluing an assembly of LEDs 8 already arranged on the film 26 in a single process.

According to the invention, therefore, it is possible to obtain a completely uniform glazing, which comprises a light pattern in its interior. The LEDs have the advantage that they only consume very little energy and dissipate practically no heat. Because of their small size, when the device is illuminated, the LEDs are virtually not visible. Therefore, it is conceivable to arrange electronic components not only on the periphery of the glazing but also on the central section or on a large portion of the glazed surface without thus impeding visibility, if the connecting circuit is formed on the basis of conductive layers.

The LEDs are generally monochromatic and are available in all tints. The light intensity of an LED generally varies between 10 and 180 mCd. By inserting a large number of LEDs, a light intensity equivalent to that of incandescent lighting can be obtained, while only requiring a much lower power consumption.

The invention is not, of course, limited to this type of embodiment or to this type of function. Any other standard electronic components that are commercially available, e.g. those designed for electronic cards, can be inserted according to the invention between two glass sheets, so long as their miniaturisation is sufficient.

The components for surface mounting as in an SMD (surface mounted device) are particularly well suited. These components can be inserted into the glazing in their usual packaging provided for surface mounting of electronic cards or in a packaging that has been specially adapted for insertion into the glazing, or even without packaging, the glazing itself forming the packaging in this case.

The invention claimed is:

1. Laminated glazing comprising:
   two glass sheets;
   one or more thermoplastic interlayers;
   light-emitting diodes (LEDs) inserted between the two glass sheets; and
   a connecting circuit formed from at least one conductive layer deposited on one face of the glass sheets or of the thermoplastic interlayers, the conductive layer being divided in at least 2 distinct areas, each area being bound to an electrode.

2. Laminated glazing according to claim 1, wherein the conductive layer has a thickness in the range of between 0.02 and 0.5 μm.

3. Laminated glazing according to claim 2, wherein the conductive layer has a resistance in the range of between 2 and 80 Ω/sq.

4. Laminated glazing according to claim 1, wherein the conductive layer is applied on the transparent substrate and zones have been insulated from the rest of the layer by narrow insulating bands.

5. Laminated glazing according to claim 4, wherein the insulating bands have a width in the range of between 0.01 and 3 mm.

6. Laminated glazing according to claim 1, wherein the LEDs and any associated casing have a thickness less than or equal to 3 mm.

7. Laminated glazing according to claim 1, wherein the LEDs comprise several semiconductor chips in a casing.

8. Laminated glazing according to claim 7, wherein the casing is dimensioned such that its length and/or a width are at least 10-times larger than its thickness.

9. Laminated glazing according to claim 7, wherein the casing has a length and/or a width in the range between 5 and 100 mm.

10. Laminated glazing according to claim 1, wherein a switch actuating the power supply of the LEDs is formed by a zone of the conductive layer insulated from the rest of the conductor layer by narrow bands.

11. Laminated glazing according to claim 1, wherein the LEDs are inserted in at least one of said one or more thermoplastic interlayers during the production of the laminated glazing.

12. Laminated glazing according to claim 1, wherein the conductive layer has a thickness in the range of between 0.2 and 0.4 μm.

13. Laminated glazing according to claim 2, wherein the conductive layer has a resistance in the range of between 10 and 80 Ω/sq.

14. Laminated glazing according to claim 12, wherein the conductive layer has a resistance in the range of between 12 and 20 Ω/sq.

15. Laminated glazing according to claim 4, wherein the insulating bands have a width in the range of between 0.05 and 1.5 mm.

16. Laminated glazing according to claim 4, wherein the insulating bands have a width in the range of between 0.1 and 0.8 mm.

17. Laminated glazing according to claim 1, wherein the LEDs and any associated casing have a thickness in the range of between 0.1 and 1.2 mm.

18. Laminated glazing according to claim 7, wherein the casing is dimensioned such that its length and/or a width are at least 20-times larger than its thickness.

19. Laminated glazing according to claim 7, wherein the casing is dimensioned such that its length and/or a width are at least 40-times larger than its thickness.

20. Laminated glazing according to claim 7, wherein the casing has a length and/or a width in the range between 15 and 75 mm.

21. Laminated glazing according to claim 7, wherein the casing has a length and/or a width in the range between 25 and 50 mm.

22. Laminated glazing according to claim 1, wherein the LEDs are substantially surrounded by said one or more thermoplastic interlayers.

23. Laminated glazing according to claim 7, wherein the casing is substantially surrounded by said one or more thermoplastic interlayers.

* * * * *